(12) United States Patent
Kovacs et al.

(10) Patent No.: US 6,825,817 B2
(45) Date of Patent: Nov. 30, 2004

(54) DIELECTRIC INTERCONNECT FRAME INCORPORATING EMI SHIELD AND HYDROGEN ABSORBER FOR TILE T/R MODULES

(75) Inventors: Alan L. Kovacs, Long Beach, CA (US); Matthew H. Peter, Los Angeles, CA (US); Kurt S. Ketola, Los Angeles, CA (US); Jacques F. Linder, Rancho Palos Verdes, CA (US)

(73) Assignee: Raytheon Company, Waltham, MA (US)

(*) Notice: Subject to any disclaimer, the term of this patent is extended or adjusted under 35 U.S.C. 154(b) by 301 days.

(21) Appl. No.: 10/210,240

(22) Filed: Aug. 1, 2002

(65) Prior Publication Data

US 2004/0023058 A1 Feb. 5, 2004

(51) Int. Cl.⁷ .............................................. H01Q 1/52
(52) U.S. Cl. ..................... 343/841; 257/682; 428/600
(58) Field of Search ........................... 343/841, 702, 343/700 MS; 257/682; 428/660, 670, 458, 651

(56) References Cited

U.S. PATENT DOCUMENTS

| 4,396,936 A | * | 8/1983 | McIver et al. ............... 174/252 |
| 4,987,425 A | | 1/1991 | Zahn |
| 5,724,048 A | | 3/1998 | Remondiere |
| 6,213,651 B1 | * | 4/2001 | Jiang et al. ..................... 385/92 |
| 6,369,924 B1 | * | 4/2002 | Scharf et al. ................ 398/117 |
| 2003/0062610 A1 | * | 4/2003 | Kovacs et al. .............. 257/682 |
| 2003/0113120 A1 | * | 6/2003 | Ohe et al. .................... 398/139 |

FOREIGN PATENT DOCUMENTS

| EP | 0 837 502 A | 4/1998 |
| JP | 2001 007628 A | 5/2001 |

\* cited by examiner

Primary Examiner—Tan Ho
(74) Attorney, Agent, or Firm—John E. Gunther; Leonard A. Alkov; Karl A. Vick

(57) ABSTRACT

A frame structure for a T/R tile module configured to transmit and receive electromagnetic radiation over a predetermined portion of the electromagnetic spectrum is provided. The frame component comprises at least one frame component formed as a single piece from a synthetic resin dielectric material. The frame component is configured to support a plurality of electrical connectors, and has a thin film coating configured to provide a ground connection and electromagnetic shield when the frame structure is incorporated into a transmit/receive module. A portion of the frame component is configured to interface with a portion of a T/R module when the frame component is incorporated into the T/R module, and the synthetic resin dielectric material provides the frame component with a range of compressibility that enables the frame component to provide the module with an effective ground connection over that range of compressibility.

16 Claims, 4 Drawing Sheets

DIELECTRIC INTERCONNECT FRAME INCORPORATING EMI SHIELD AND HYDROGEN ABSORBER FOR TILE T/R MODULES

CROSS-REFERENCE TO RELATED APPLICATION

The present application is related to application Ser. No. 09/965,759, filed on Sep. 22, 2001, and entitled "Multilayer Thin Film Hydrogen Getter" [PD-00W124]. That application is directed to hydrogen getters, used in GaAs hermetically-sealed packaging.

TECHNICAL FIELD

The present invention relates to a frame component which is particularly useful in a three-dimensional (3D) interconnect for a tile transmit/receive (T/R) module.

BACKGROUND ART

Tile T/R modules are a variation of radar T/R modules for phase shift antenna applications, and various other devices that transmit and/or receive transmissions over predetermined portions of the electromagnetic spectrum. In a 3D T/R tile module, several circuit components, each of which may include semiconductor material, such as gallium arsenide (GaAs), are connected to each other by an interconnect device which typically comprises an interconnect frame and a plurality of electrical connectors. The electrical connectors need to be insulated from each other, and the module needs to have a ground connection and a shield against electromagnetic interference (EMI). The electrical connectors are typically connected with the circuit components by means of compliant devices such as Fuzz Buttons or Pogo pins, which are well known in the art.

A known interconnect frame in a 3D T/R tile module comprises machined aluminum frame components which are assembled with and support the electrical connectors. The frame components typically include individual passages for the connectors, and a dielectric insert in each connector passage and surrounding the connector in the passage. The aluminum frame components provide the ground connection and EMI shielding for the module.

In forming an aluminum metal interconnect frame, the frame generally requires numerous components (e.g., 22 different types of components) in order to build the interconnect. In addition with GaAs devices, gettering for materials such as hydrogen which can poison the GaAs material is critical, and, as explained in application Ser. No. 09/965, 759, traditional gettering techniques have limitations, particularly with regard to the surfaces to which the hydrogen getters can be applied.

It has been suggested that casting an aluminum frame and molding the dielectric inserts can reduce costs. However, such a construction is believed to be significantly more costly than the concept of the present invention. Moreover, an all-metal frame generally provides no compressibility in the frame at the interface of the frame and the other components of the T/R module. This means that extremely precise manufacturing tolerances, and virtually no margin for error, are required to provide effective grounding to such a T/R module.

SUMMARY OF THE PRESENT INVENTION

The present invention provides a new and useful interconnect frame structure for a transmit/receive (T/R) module that transmits and receives electromagnetic radiation over a predetermined portion of the electromagnetic spectrum. The interconnect frame of the present invention is particularly useful in a 3D T/R module, and is designed to be cost effective, and to address the types of issues discussed above in connection with the effective design of such an interconnect frame.

According to the present invention, the interconnect frame comprises at least one frame component formed as a single piece (e.g., as a molded article) from a synthetic resin dielectric material. The frame component is configured to support a plurality of electrical connectors, and has a thin film coating configured to provide a ground connection and EMI shield when the frame structure is incorporated into a transmit/receive module. The dielectric material selection can be tailored for various RF applications by choosing the dielectric constant and loss tangent.

The thin film coating is preferably formed in accordance with U.S. patent application Ser. No. 09/965,759, which application is incorporated herein by reference, and includes (i) a metal layer (e.g., aluminum) that provides a ground connection and EMI shield, (ii) a thin adhesion layer of material (e.g., titanium) between the metal layer and the frame component, (iii) a getter (e.g., a titanium layer in a predetermined thickness) for absorbing hydrogen that can contaminate high performance GaAs devices of a transmit/receive module, and (iv) a palladium layer on top of the getter layer to prevent oxidation of the getter layer while allowing hydrogen to pass through to the getter layer.

According to the present invention, the synthetic resin dielectric material provides the frame component with a range of compressibility such that when the frame component is interfaced with a component of a T/R module, the frame component provides the T/R module with an effective ground connection over that range of compressibility.

According to a preferred embodiment, the frame structure comprises a pair of frame components, each of which has the foregoing structure and configuration, and each of which is configured to support respective portions of each of a plurality of electrical connectors.

Further features of the present invention will be apparent from the following detailed description and the accompanying drawings.

BEST MODES FOR CARRYING OUT THE INVENTION

As described above, the present invention provides an interconnect frame for a T/R module that transmits and receives electromagnetic radiation over a predetermined portion of the electromagnetic spectrum. The principles of the present invention are described below in connection with a generic configuration for a T/R module configured to transmit and receive RF signals. However, from the description, it will be clear how the present invention can be applied to various types of T/R modules will be apparent to those in the art.

Figure 1:
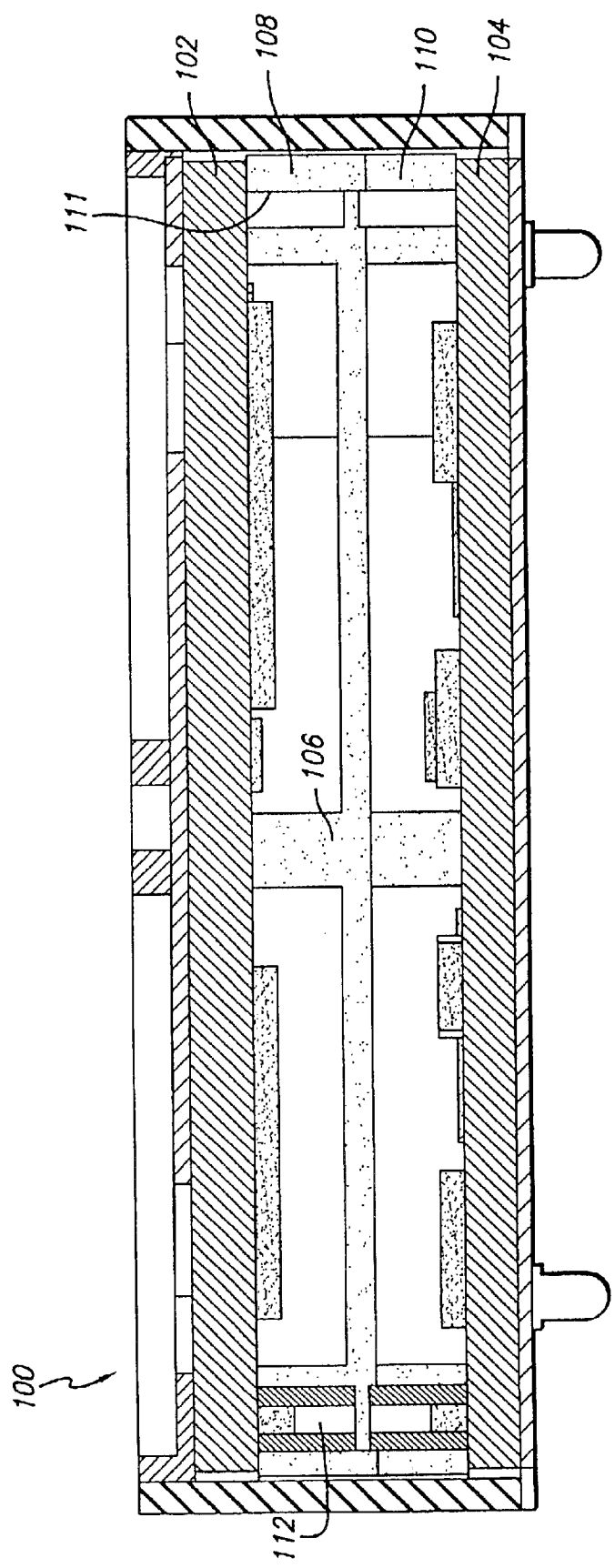
FIG. 1 is a schematic cross sectional illustration of a portion of a 3D T/R module incorporating an interconnect frame according to the principles of the present invention.

FIG. 1 schematically illustrates essential components of a three-dimensional (3D) T/R module 100 having an interconnect frame according to the principles of the present invention. The T/R module 100 comprises a pair of T/R circuit components 102, 104, and an interconnect frame 106 disposed between the T/R circuit components. Each of the T/R circuit components 102, 104 can be, e.g., a Monolithic Microwave Integrated Circuit (MMIC) type, with a gallium arsenide (GaAs) semiconductor. The interconnect frame 106 is formed according to the principles of the present and includes a plurality of electrical connectors 112 which interconnect the T/R circuit components 102, 104. In a 3D tile T/R module, there may be additional circuit components, and additional electrical connectors interconnecting those circuit components, or providing input/output (I/O) connections for the module, as will be apparent to those in the art.

The interconnect frame 106 is formed by a pair of frame components 108, 110 (see also FIGS. 2, 3, and 5), each of which formed as a single piece (e.g., as a molded article) from a synthetic resin dielectric material. Preferably, each frame component is injection molded from a synthetic resin sold under the registered mark VECTRA® (which is registered to Celanese Corporation, New York, N.Y.), and which resin is capable of being injection molded, extruded, thermoformed and machined for various high performance plastic applications. For the current embodiment, molded materials can be selected for dielectric constant and loss tangent, based on the particular RF application. The frame components have less weight than metal frame components, and are more cost effective to produce than metal frame components. Additionally, by forming the frame components as single piece structures, the number of parts required to form an interconnect frame for a T/R tile module is significantly reduced, in comparison to the number of parts required to form a metal interconnect frame for such a module.

Figure 2:
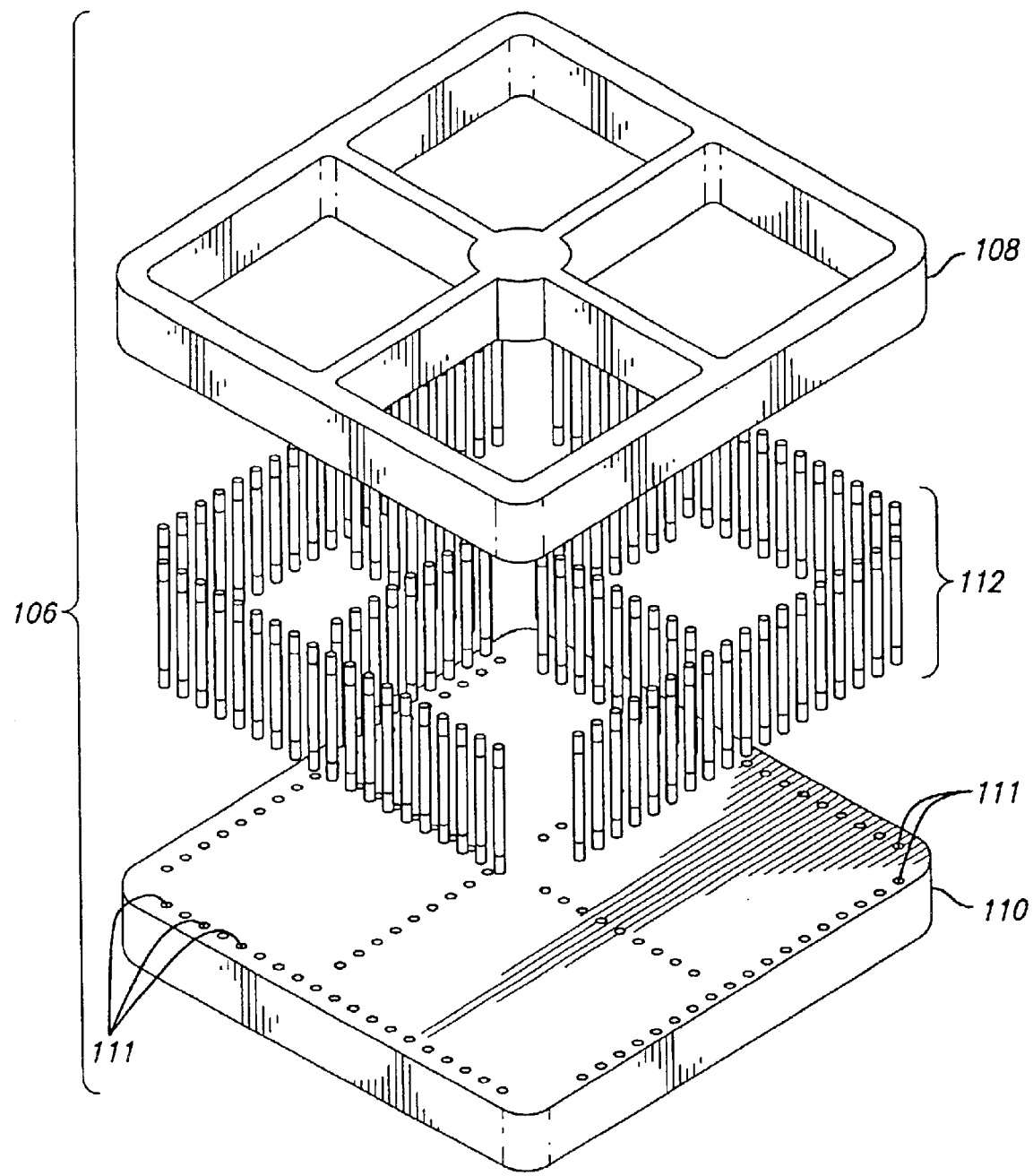
FIG. 2 is an exploded view of some of the components forming an interconnect frame according to the principles of the present invention.
Figure 3:
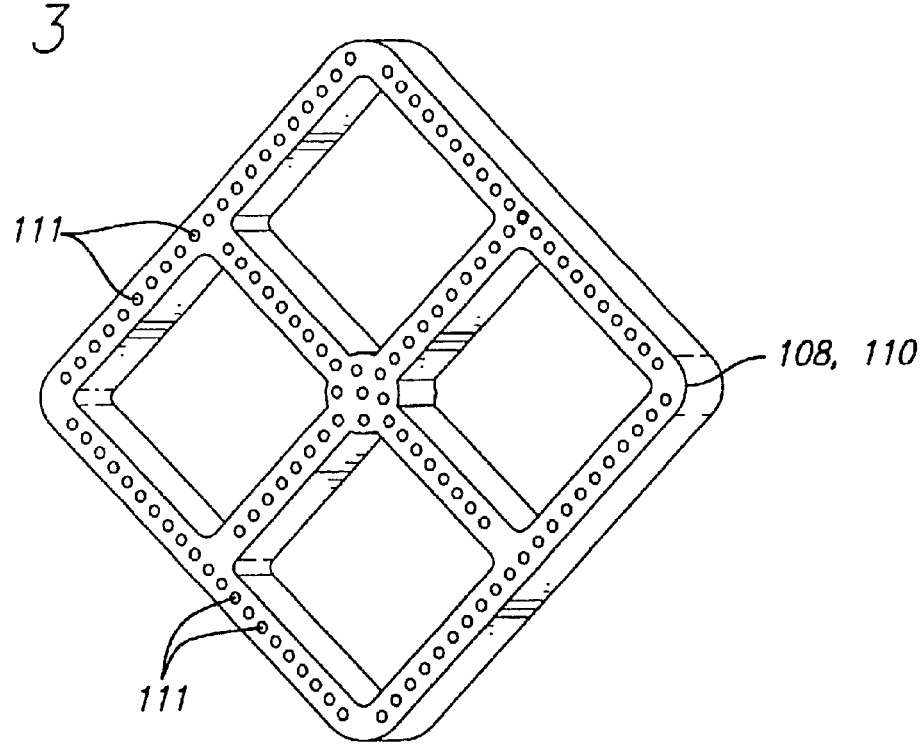
FIG. 3 is a schematic, three dimensional illustration of a frame component according to the present invention, with the thin film coating applied thereto.
Figure 5:
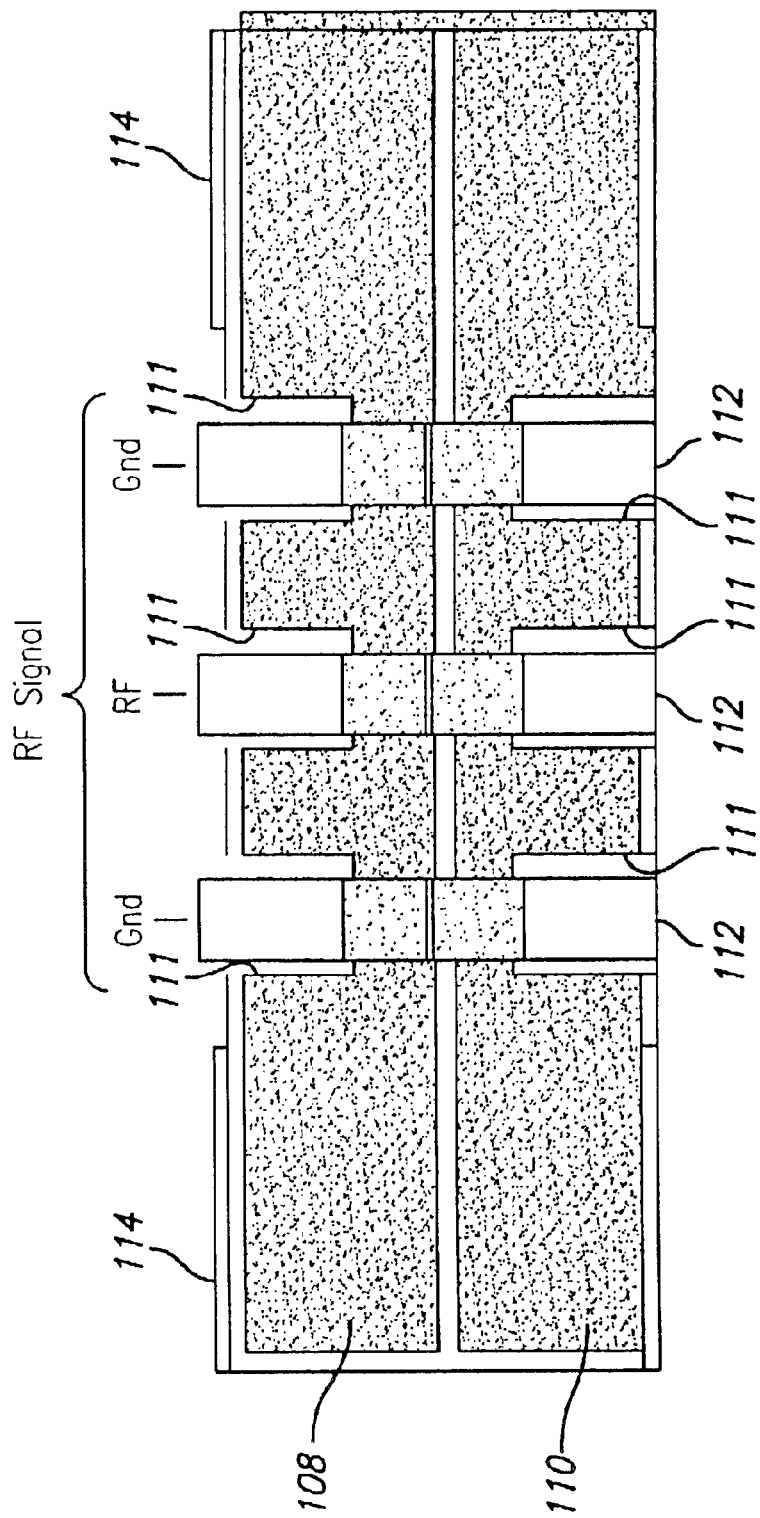
FIG. 5 is a schematic illustration of a portion of an interconnect frame according to the present invention with several of the electrical connectors supported by the frame.

Each of the frame components 108, 110 is configured to support a respective portion of a plurality of the electrical connectors 112 which extend between the T/R circuit components 102, 104 (FIGS. 2 and 5). Each frame component 108, 110 includes a plurality of apertures 111 (FIGS. 2, 3, and 5), each of which is preferably cylindrical, and each of which is configured to support a respective portion of a single electrical connector 112. When the pair of frame components 108, 110 supports a plurality of electrical connectors 112, the electrical connectors extend through the pair of frame components, and engage respective portions of the T/R circuit components 102, 104. Compliant conductive contact concepts, known to those in the art as Pogo Pins and Fuzz Buttons, are used to provide compliant connections between the electrical conductors and the T/R circuit components.

In a T/R tile module with an interconnect frame according to the present invention, a portion of each of the frame component is configured to interface with a portion of a respective transmit/receive module component when the frame component is incorporated into the transmit/receive module. As seen in FIGS. 1 and 5, the frame components are designed for effective contact with portions of the T/R modules, and one purpose of such contact is to enable the frame components to provide effective ground connection for the T/R module circuit components. The synthetic resin dielectric material provides each of the frame components with a range of compressibility such that effective ground connection with the circuit components of the T/R tile module can be made with a frame component that is up to 5 to 7 mils out of flat. Such compressibility enables the frame components to provide the module with an effective ground connection over that range of compressibility.

Figure 4:
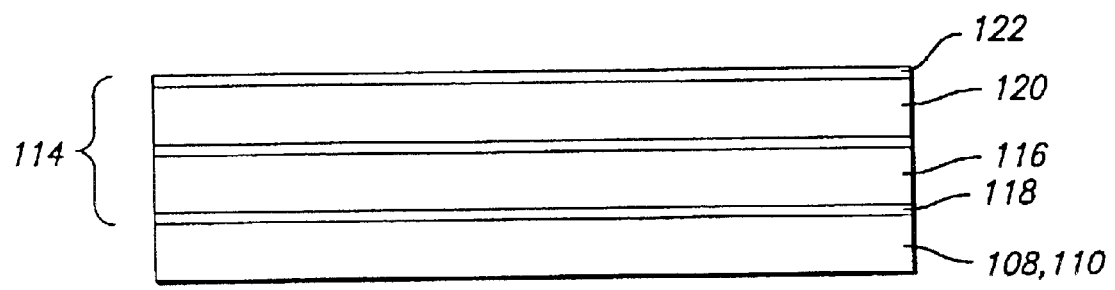
FIG. 4 is a schematic illustration of the thin film coating on the interconnect frame of the present invention.

Each of the frame components 108, 110 has a thin film coating 114 (FIGS. 4 and 5) configured to provide a ground connection and EMI shield when the frame structure is incorporated into a T/R tile module. The EMI shield is provided between multiple channels within a single module and between transmit and receive paths within a single channel. The thin film coating 114 is preferably formed in accordance with U.S. patent application Ser. No. 09/965,759, filed Sep. 22, 2001, which is incorporated herein by reference. (A copy of application Ser. No. 09/965,759 is attached hereto has Exhibit A.) The thin film coating 114 is schematically illustrated in FIG. 4, and includes (i) a metal layer 116 (formed e.g., of aluminum or copper) that provides a ground connection and EMI shield, (ii) a thin layer of connective (adhesion) material 118 (e.g., a 20 nm thick layer of titanium) connecting the metal layer 116 to the frame component 108, 110, (iii) a getter layer 120 (e.g., a titanium getter layer in a thickness of about 40 to 80 micro inches) for materials (e.g., hydrogen) that can contaminate high performance GaAs in a T/R module), and (iv) a palladium layer 122 (about 8 micro inches thick) on top of the getter layer 120. The palladium layer prevents oxidation of the getter layer 120, while allowing hydrogen to pass through to the getter layer.

The thin film hydrogen getter/EMI shield comprises a vacuum deposited multilayer film as shown in FIG. 4. The EMI film is a thin (e.g., 20 nm or 100 to 250 Ångstrom thick) Ti adhesion layer 118 followed by an aluminum (Al) (or copper) layer 116 that is 100 to 200 micro inches thick, which provides 5 to 6 skin depths for wave propagation. The getter layer 120 comprises a 40 to 80 micro inch thick titanium (Ti) layer, covered with an 8 micro inch palladium (Pd) layer 122. All layers are deposited during the same processing run at a vacuum of about $10^{-6}$ Torr. The thin film is particularly useful with frame components formed of dielectric materials, and designed for use in microelectronic modules containing GaAs devices. An alternate film structure is one in which the high conductivity Al film is replaced by electroless metal. In this case, the titanium adhesion layer is deleted. Subsequently, the getter and palladium films are deposited using the aforementioned evaporation process.

With an interconnect frame with the foregoing thin film coating, it is expected that hydrogen should not desorb from titanium for temperatures below 500° C. Additionally, the pumping speed is proportional to getter surface area, the presence of helium and nitrogen doesn't impede the sorption of hydrogen by the getter, and hydrogen pumping speed increases with temperature, and all of the foregoing features are useful in a thin film coating for an interconnect frame. In addition, with the foregoing frame structure, it is believed that the cost of the interconnect frame can be significantly reduced in comparison to an all metal interconnect frame. Finally, as can be seen from the foregoing description, the interconnect frame comprises relatively few components in comparison to an all metal frame, which is a significant factor in the construction of high precision frames for high performance T/R modules.

Moreover, the foregoing thin film is believed to provide the following features which are useful in an interconnect frame designed for a high performance T/R tile module environment: (i) high hydrogen pumping speeds (0.15 cc/sec per $cm^2$ at 23° C.), (ii) the hydrogen removal rate of the thin film getter when the hydrogen pressure at 1 Torr is $2\times10^{-4}$ standard cc of hydrogen per second, which is 1000 times faster than worst case hydrogen evolution rate in a hermetically sealed package, (iii) the hydrogen capacity is 135 Torr·cc per mg of titanium, which is high since the thin film only needs to absorb about 75 Torr·cc of $H_2$ over the lifetime of the T/R module, (iv) hydrogen pumping speed remains relatively high for temperatures down to 0° C. (the pumping speed at 0° C. is 30% of its value at room temperature), and (v) with the highly conductive sub layer film or metal deposits which provide ground connections for the T/R module as well as EMI shielding for use on dielectric packaging materials 5 to 6 skin depths are easily provided for low resistance wave propagation.

Thus, as seen from the foregoing description, the present invention provides a cost effective 3D interconnect for tile modules which will provide a hydrogen free environment for highly reliable GaAs based T/R modules. With the foregoing disclosure in mind, there will be other modifications and developments that will be apparent to those in the art.

What is claimed is:

1. A frame structure for a transmit/receive module configured to transmit and receive electromagnetic radiation over a predetermined portion of the electromagnetic spectrum, comprising a least one frame component formed as a single piece from a synthetic resin dielectric material, said frame component configured to support a plurality of electrical connectors, and a thin film coating on a selected portion of said frame component; said thin film coating configured to provide a ground connection and electromagnetic shield when said frame structure is incorporated into a transmit/receive module.

2. The frame structure of claim 1, wherein said thin film coating includes a metal layer that provides the ground connection and electromagnetic shield.

3. The frame structure of claim 2, wherein said metal layer is connected to said frame component by a thin layer of connective material.

4. The frame structure of claim 3, wherein said metal layer comprises an aluminum layer, and said thin layer of connective material comprises a layer of titanium.

5. The frame structure of claim 4, wherein said thin film coating is further configured to provide a getter for materials that can contaminate a transmit/receive module.

6. The frame structure of claim 5, wherein said frame component is configured to be incorporated into a transmit/receive module which includes GaAs semiconductor material, and wherein said thin film coating is configured to provide a getter for hydrogen.

7. The frame structure of claim 6, wherein said thin film coating includes a titanium getter layer disposed on top of said metal layer.

8. The frame structure of claim 7, wherein said thin film coating includes a palladium layer on top of said titanium getter layer.

9. The frame structure of claim 8, wherein said frame component is formed of molded synthetic resin dielectric material.

10. The frame structure of claim 9, wherein a portion of said frame component is configured to interface with a portion of a transmit/receive module when the frame component is incorporated into the transmit/receive module, and wherein said synthetic resin dielectric material provides the portion of said frame component with a range of compressibility that enables the frame component to provide the module with an effective ground connection over that range of compressibility.

11. The frame structure of claim 10, comprising a pair of said frame components, each of which is configured to support respective portions of each of a plurality of electrical connectors.

12. The frame structure of claim 1, comprising a pair of said frame components, each of which is configured to support respective portions of each of a plurality of electrical connectors.

13. The frame structure of claim 12, wherein each of said pair of frame components is formed of molded synthetic resin dielectric material.

14. The frame structure of claim 1, wherein a portion of said frame component is configured to interface with a portion of a transmit/receive module when the frame component is incorporated into the transmit/receive module, and wherein said synthetic resin dielectric material provides the portion of said frame component with a range of compressibility that enables the frame component to provide the module with an effective ground connection over that range of compressibility.

15. The frame structure of claim 14, wherein said frame component is formed of molded synthetic resin dielectric material.

16. The frame structure of claim 14, comprising a pair of said frame components, each of which is configured to support respective portions of each of a plurality of electrical connectors.

* * * * *